United States Patent
Li et al.

(10) Patent No.: US 7,817,427 B2
(45) Date of Patent: Oct. 19, 2010

(54) FASTENER AND HEAT SINK ASSEMBLY HAVING THE SAME

(75) Inventors: Min Li, Shenzhen (CN); Lei Cao, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 49 days.

(21) Appl. No.: 12/409,517

(22) Filed: Mar. 24, 2009

(65) Prior Publication Data

US 2010/0142152 A1  Jun. 10, 2010

(30) Foreign Application Priority Data

Dec. 5, 2008  (CN)  ......................... 2008 1 0306006

(51) Int. Cl.
*H05K 7/20* (2006.01)
*F16B 37/04* (2006.01)

(52) U.S. Cl. ........................ 361/719; 165/80.3; 165/185; 257/704; 24/458; 248/505; 248/510; 411/181

(58) Field of Classification Search ................. 257/719; 361/719

See application file for complete search history.

(56) References Cited

U.S. PATENT DOCUMENTS

| | | | | |
|---|---|---|---|---|
| 6,307,748 | B1 * | 10/2001 | Lin et al. | 361/704 |
| 6,480,387 | B1 * | 11/2002 | Lee et al. | 361/704 |
| 7,283,368 | B2 * | 10/2007 | Wung et al. | 361/719 |
| 7,342,795 | B2 * | 3/2008 | Lee et al. | 361/719 |
| 7,405,939 | B2 * | 7/2008 | Yang | 361/719 |
| 7,554,810 | B1 * | 6/2009 | Sun et al. | 361/719 |
| 7,652,886 | B2 * | 1/2010 | Li et al. | 361/719 |
| 7,729,122 | B2 * | 6/2010 | Wong | 361/710 |
| 2007/0091576 | A1 * | 4/2007 | Wung et al. | 361/719 |
| 2007/0217153 | A1 * | 9/2007 | Lai et al. | 361/700 |
| 2009/0266512 | A1 * | 10/2009 | Lu | 165/80.3 |

\* cited by examiner

*Primary Examiner*—Gregory D Thompson
(74) *Attorney, Agent, or Firm*—Frank R. Niranjan

(57) ABSTRACT

A fastener includes a fastener post, a sleeve, a nut and an elastic element. The fastener post includes a shaft, a tapered portion and a threaded portion. The sleeve includes a smooth portion and a clamp portion having a number of resilient strips. The nut is threaded onto the threaded portion. The elastic element is disposed around the sleeve and compressed between the nut and an ear of a heat sink to generate a resilient force. The resilient force moves the tapered portion of the fastener post into the sleeve such that the strips of the clamp portion of the sleeve are tilted outwardly to tightly abut against a bottom of a printed circuit board on which the heat sink is mounted.

14 Claims, 3 Drawing Sheets

FASTENER AND HEAT SINK ASSEMBLY HAVING THE SAME

BACKGROUND

1. Technical Field

The present disclosure relates to heat dissipation and, particularly, to a fastener attached to a heat sink, and a heat sink assembly including such a heat sink and a fastener.

2. Description of Related Art

A heat sink is usually placed in thermal contact with a heat generating electronic device such a central processing unit (CPU), and transfers heat through conduction away from the heat generating electronic device to prevent overheating of the heat generating device.

Conventionally, a linear clip is used to secure a heat sink to a heat generating device by fastening the clip to a printed circuit board on which the heat generating device is mounted. The linear clip, which is integrally made from a resilient metal wire, generally includes an elongated pressing portion and a pair of locking arms extending from opposite ends of the elongated pressing portion in opposite directions to thereby form a Z-shaped configuration. When attached, the elongated pressing portion of the clip abuts a base of the heat sink toward the heat generating device, and the locking arms resiliently engage clasps provided on the printed circuit board to thereby secure the heat sink to the heat generating device.

In operation, due to its resilient linear structure, the clip often only provides a very limited contact area for a user to apply force to the clip. Increased force must thus be applied on the clip to firmly secure the clip to the printed circuit board. However, the stronger force may damage the heat generating device.

What is needed, therefore, is a fastener easily attached to and detached from a heat sink, and a heat sink assembly including such a heat sink and a fastener, thereby overcoming the described limitations.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE EMBODIMENT

Figure 1:
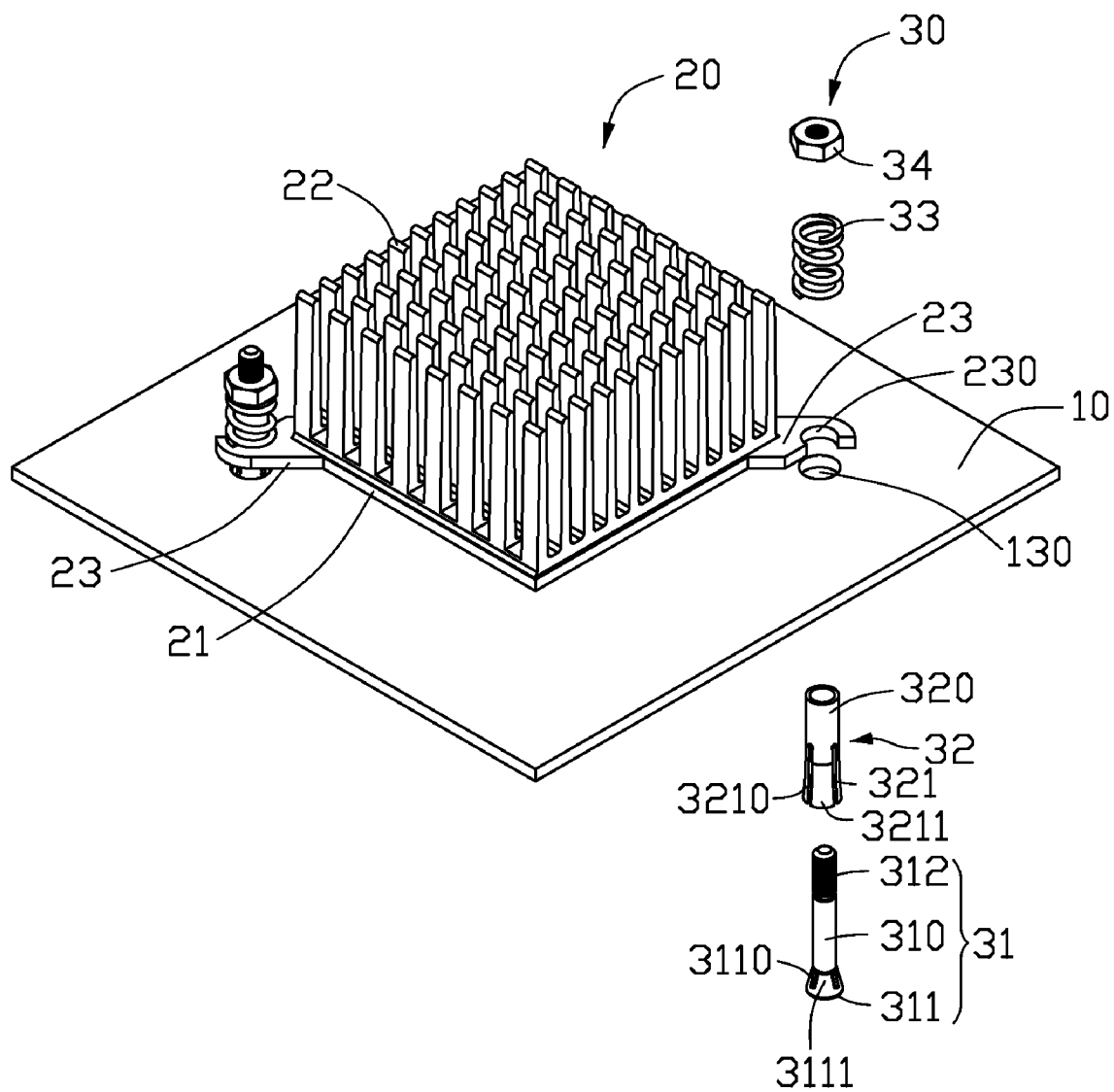
FIG. 1 is a partially exploded, isometric view of a heat sink assembly in accordance with an embodiment of a present disclosure, showing a printed circuit board on which the heat sink assembly is mounted.
Figure 3:
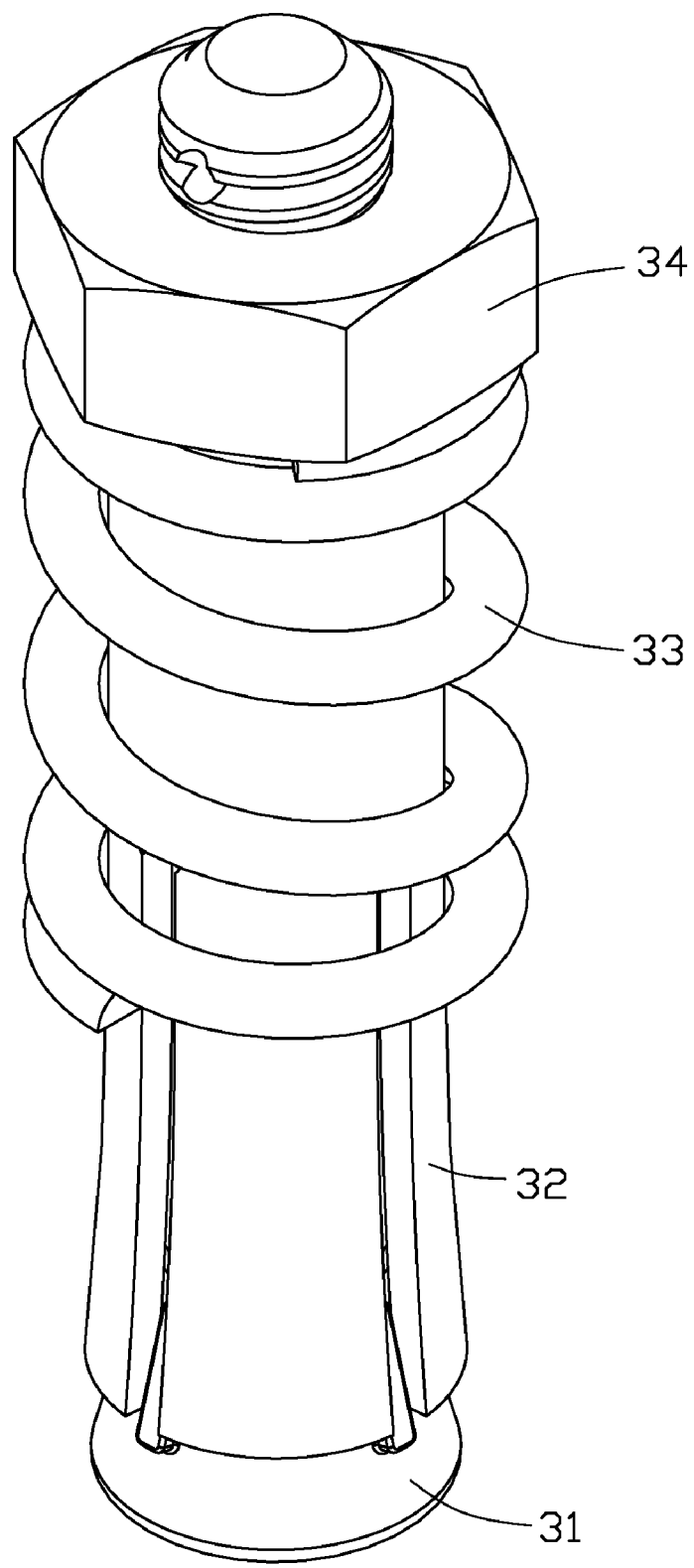
FIG. 3 shows a fastener of the heat sink assembly of FIG. 2.

Referring to FIG. 1 and FIG. 3, an embodiment of a heat sink assembly mounted on a printed circuit board (PCB) 10 is shown. The heat sink assembly includes a heat sink 20 and two fasteners 30. A heat generating element (not shown) is mounted on a top surface of the PCB 10. The two fasteners 30 are fastened to the PCB 10 and secure the heat sink 20 to the heat generating element. Two first mounting holes 130 are defined in the PCB 10.

The heat sink 20 includes a base 21 and a plurality of fins 22 extending from a top surface thereof. A bottom structure of the base 21 corresponds to a top structure of the heat generating element in order to tightly conform thereto. In the illustrated embodiment, the base 21 is configured as a rectangular structure. Two ears 23 extend from two opposite corners of the base 21, respectively. Each ear 23 defines a second mounting hole 230 corresponding to the first mounting hole 130 of the PCB 10. A diameter of each second mounting hole 230 is substantially equal to a diameter of each first mounting hole 130.

Each fastener 30 includes a fastener post 31, a sleeve 32 receiving the fastener post 31, an elastic element 33 positioned around the sleeve 32 and a nut 34 engaging the fastener post 31.

The fastener post 31 is an integral structure and includes a shaft 310, a tapered portion 311 and a threaded portion 312. The tapered portion 311 extends downwardly from a bottom end of the shaft 310 with a diameter thereof increasing from top to bottom. The threaded portion 312 is formed on a circumference of an outer surface of a top portion of the shaft 310. The tapered portion 311, the threaded portion 312 and the shaft 310 are aligned along a same axis. A plurality of ridges 3110 protrudes from an outer surface of the tapered portion 311 and longitudinally extends from a top end of the tapered portion 311 (i.e., the bottom end of the shaft 310) to a bottom end of the tapered portion 311. The ridges 3110 either connect to or do not connect to the bottom end of the tapered portion 311. That is, a length of each ridge 3110 is equal to or less than a distance on the outer surface of the tapered portion 311 between the top end and the bottom end of the tapered portion 311. The ridges 3110 radiate downwardly and outwardly relative to the axis of the tapered portion 311, equidistantly spaced from each other. Each two adjacent ridges 3110 cooperatively define a recess 3111.

The sleeve 32 is cylindrical and includes a smooth portion 320 and a resilient clamp portion 321 engaging the tapered portion 311 of the fastener post 31. A plurality of slots 3210 corresponding to the ridges 3110 of the fastener post 31 is defined in the clamp portion 321. Each slot 3210 extends from a bottom edge of the clamp portion 321 to the smooth portion 320 such that the clamp portion 321 is divided into a plurality of resilient strips 3211 spaced from each other. One end of the strips 3211 is connected to the smooth portion 320, and the other end thereof are free or separated from each other. When the sleeve 32 is mounted on the fastener post 31, each ridge 3110 of the tapered portion 311 of the fastener post 31 enters the corresponding slot 3210 of the clamp portion 321 of the sleeve 32, and, simultaneously, each strip 3211 of the clamp portion 321 of the sleeve 32 is sandwiched between adjacent ridges 3110 of the tapered portion 311 of the fastener post 31. An inner diameter of the smooth portion 320 is less than an outer diameter of the bottom end of the tapered portion 311 of the fastener post 31.

The elastic element 33 can be compressed along an axial direction thereof. In the illustrated embodiment, the elastic element 33 is a helical spring.

Figure 2:
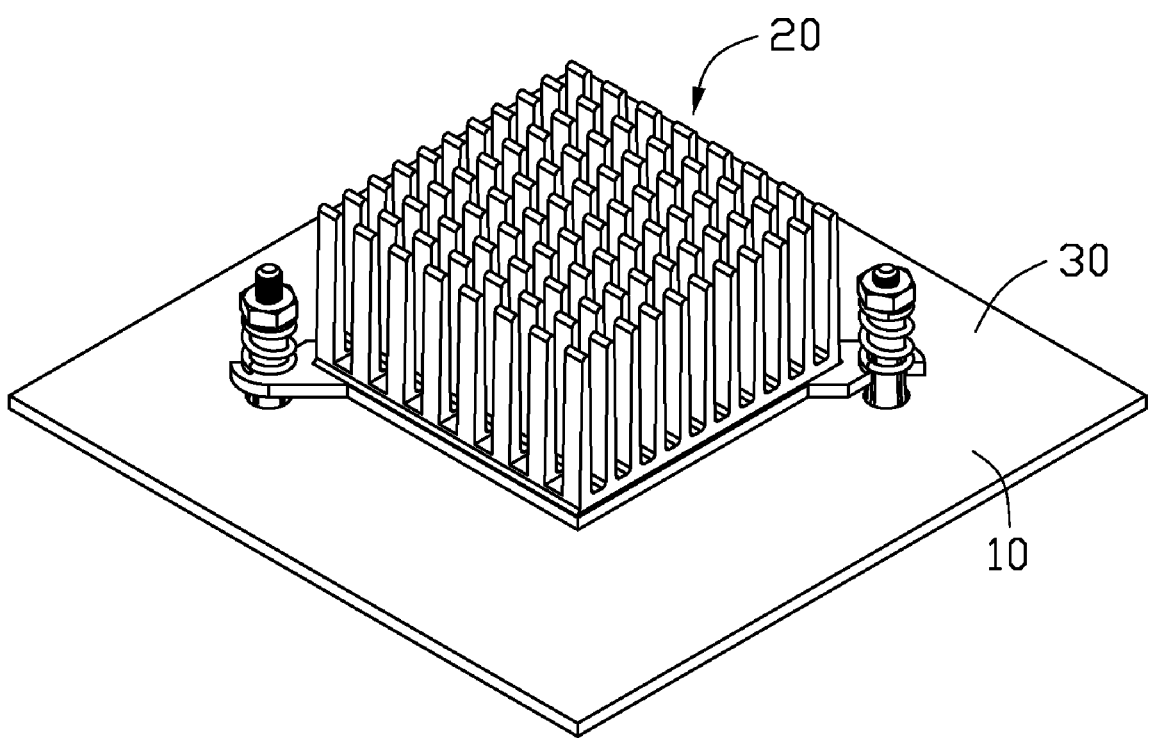
FIG. 2 is an assembled view of the heat sink assembly with the printed circuit board of FIG. 1.

Referring to FIG. 2, in pre-assembly, the heat sink 20 is first placed on the top surface of the heat generating element of the PCB 10. The second mounting holes 230 of the ears 23 are respectively aligned with the first mounting holes 130 of the PCB 10.

The fastener post 31 is first inserted into the sleeve 32 from the bottom up, and then an assembly of the fastener post 31 and the sleeve 32 extends through the first mounting hole 130 and the second mounting hole 230 from the bottom up. Alternatively, the sleeve 32 first extends through the first mounting hole 130 and the second mounting hole 230 from the bottom up or from the top down, and then the fastener post 31 enters the sleeve 32 from the bottom up.

The elastic element 33 is disposed around the sleeve 32. The nut 34 is threaded onto the threaded portion 312 of the fastener post 31. At this state, a top portion of the elastic element 33 abuts the nut 34, and a bottom portion thereof abuts a top surface of the ear 23. A top surface of the sleeve 32 abuts the nut 34, and the bottom edge of the clamp portion 321 of the sleeve 32 abuts the top end of the tapered portion 311, that is, the bottom end of the shaft 310, of the fastener post 31.

For secure fixing of the heat sink 20 to the PCB 10, the nut 34 is threaded downwardly to compress the elastic element 33, which generates a resilient force on the nut 34 and the ear 23 of the heat sink 20. The nut 34, together with the fastener post 31, is impelled upwardly by the resilient force. In the process of threading the nut 34, as the nut 34 is impelled downwardly due to being threaded, while at the same time being impelled upwardly by the elastic element 33, the nut 34 remains inactive/stationary relative to the top surface of the ear 23, such that a distance between the nut 34 and the top surface of the ear 23 is unchanged during threading of the nut 34. Being restricted by the nut 34, the sleeve 32 remains inactive/stationary, while the fastener post 31, driven by the nut 34, gradually moves upwardly relative to the sleeve 32. The tapered portion 311 of the fastener post 31 thus moves into the clamp portion 321 of the sleeve 32 such that the strips 3211 of the clamp portion 321 of the sleeve 32 tilt outwardly. A diameter of an opening defined by the free ends of the strips 3211 of the clamp portions 321 moves to exceed a diameter of the first mounting hole 130 of the PCB 10. As a result, the free ends of the strips 3211 of the clamp portions 321 abut a bottom side of the PCB 10 surrounding the first mounting hole 130. In this way, the heat sink 20 is firmly mounted to the PCB 10. In addition, during clockwise threading of the nut 34, the ridges 3110 engaged in the corresponding slot 3210 prevent the fastener post 31 from rotating relative to the sleeve 32.

In addition, after mounting the heat sink 20 to the PCB 10 by threading the nut 23 onto the threaded portion 312, a top end of the threaded portion 312 beyond the nut 23 can be removed to prevent accidental separation of the nut 23 from the threaded portion 312.

For detachment of the heat sink 20 from the PCB 10, the nut 34 is threaded upwardly to release the elastic element 33. No resilient force is generated by the elastic element 33 on nut 34 and the 23 of the heat sink 20. Thus, the nut 34 with the fastener post 31 moves upwardly relative to the top surface of the ear 23, such that distance between the nut 34 and the top surface of the ear 23 increases, eventually leaving the sleeve 32 unrestricted. As a result, the strips 3211 of the clamp portion 321 of the sleeve 32 gradually generate a restoring force to move the tapered portion 311 of the fastener post 31 out of the sleeve 32. When the diameter of the opening defined by the free ends of the strips 3211 of the clamp portions 321 becomes less than the diameter of the first mounting hole 130 of the PCB 10 and the second mounting hole 230 of the ear 23, the free ends of the strips 3211 of the clamp portions 321 move out of the first mounting hole 130 of the PCB 10 and the second mounting hole 230 of the ear 23 from the bottom up. Then, the fastener post 31, the sleeve 32 and the elastic element 33 are removed from the first mounting hole 130 of the PCB 10 and the second mounting hole 230 of the ear 23. The heat sink 20 is detached from the PCB 10.

As the top end of the threaded portion 312 is destroyed, the nut 34 together with the fastener post 31 leaves the first mounting hole 130 and the second mounting hole 230. Due to the action of the nut 34, the sleeve 32 and the fastener post 31 are removed from the PCB 10 and the heat sink 20 bottom to top.

The fasteners 30 of the illustrated embodiment can attach the heat sink 20 to the PCB 10 in a simple and convenient manner, while further enhancing the stability and security of the attachment.

It is to be understood, however, that even though numerous characteristics and advantages of the present embodiments have been set forth in the foregoing description, together with details of the apparatus and function of the embodiments, the disclosure is illustrative only, and changes may be made in detail, especially in matters of shape, size, and arrangement of parts within the principles of the embodiments to the full extent indicated by the broad general meaning of the terms in which the appended claims are expressed.

What is claimed is:

1. A fastener for securing a heat sink to a printed circuit board, comprising:
   a fastener post comprising a shaft and a tapered portion, the tapered portion extending from an end of the shaft, a diameter of the tapered portion gradually increasing along a direction away from the shaft, with a threaded portion formed on another end of the shaft opposite to the tapered portion;
   a sleeve capable of receiving the fastener post therein, the sleeve comprising a smooth portion and a clamp portion corresponding to the tapered portion of the fastener post, the clamp portion comprising a plurality of resilient strips spaced from each other, and each of the resilient strips having a free end away from the smooth portion;
   a nut configured to be threaded onto the threaded portion; and
   an elastic element disposed around the sleeve,
   wherein, when the nut is threaded to compress the elastic element, resilient force generated by the compressed elastic element impels the tapered portion of the fastener post into the sleeve such that the strips of the clamp portion of the sleeve tilted outwardly.

2. The fastener of claim 1, wherein the shaft, the tapered portion and the threaded portion are aligned along a same axis.

3. The fastener of claim 2, wherein an inner diameter of the smooth portion is less than an outer diameter of a bottom end of the tapered portion.

4. The fastener of claim 3, wherein a plurality of ridges protrudes from an outer surface of the tapered portion and longitudinally extends from a top end of the tapered portion to the bottom end of the tapered portion.

5. The fastener of claim 4, wherein a length of each ridge is equal to or less than a distance on the outer surface of the tapered portion between the top end and the bottom end of the tapered portion.

6. The fastener of claim 4, wherein the ridges radiate downwardly and outwardly relative to an axis of the tapered portion and are equidistantly spaced from each other.

7. The fastener of claim 4, wherein each two adjacent ridges cooperatively define a recess therebetween receiving a corresponding strip of the clamp portion of the sleeve.

8. A heat sink assembly, comprising:
   a printed circuit board (PCB) defining a first mounting hole therein;
   a heat sink defining a second mounting hole therein; and
   a fastener comprising:
      a sleeve extending through the first mounting hole and the second mounting hole, the sleeve comprising a smooth portion and a clamp portion, the clamp portion comprising a plurality of resilient strips spaced from each other, and each of the resilient strips having a free end away from the smooth portion;

a fastener post comprising a shaft and a tapered portion, the tapered portion extending from an end of the shaft, a diameter of the tapered portion gradually increasing along a direction away from the shaft, a threaded portion being formed on another end of the shaft opposite to the tapered portion, the shaft extending through the sleeve with the tapered portion thereof engaging the clamp portion of the sleeve and the threaded portion beyond the smooth portion of the sleeve;

a nut threading on the threaded portion; and an elastic element disposed around the sleeve and compressed between the nut and the heat sink, wherein the compressed elastic element provides a resilient force to the nut to move the tapered portion of the fastener post into the sleeve such that the strips of the clamp portion of the sleeve are tilted outwardly to thereby abut the PCB.

9. The heat sink assembly of claim 8, wherein the shaft, the tapered portion, and the threaded portion are aligned along a same axis.

10. The heat sink assembly of claim 9, wherein an inner diameter of the smooth portion is less than an outer diameter of a bottom end of the tapered portion.

11. The heat sink assembly of claim 10, wherein a plurality of ridges protrudes from an outer surface of the tapered portion and longitudinally extends from a top end of the tapered portion to the bottom end of the tapered portion.

12. The heat sink assembly of claim 11, wherein a length of each ridge is equal to or less than a distance on the outer surface of the tapered portion between the top end and the bottom end of the tapered portion.

13. The heat sink assembly of claim 11, wherein the ridges radiate downwardly and outwardly relative to an axis of the tapered portion and are spaced equidistant from each other.

14. The heat sink assembly of claim 11, wherein each two adjacent ridges cooperatively define a recess therebetween receiving a corresponding strip of the clamp portion of the sleeve.

* * * * *